United States Patent
Ware et al.

(10) Patent No.: US 8,154,947 B2
(45) Date of Patent: *Apr. 10, 2012

(54) MULTI-COLUMN ADDRESSING MODE MEMORY SYSTEM INCLUDING AN INTEGRATED CIRCUIT MEMORY DEVICE

(75) Inventors: Frederick A. Ware, Los Altos Hills, CA (US); Lawrence Lai, San Jose, CA (US); Chad A. Bellows, Burlingame, CA (US); Wayne S. Richardson, Saratoga, CA (US)

(73) Assignee: RAMBUS Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/239,846

(22) Filed: Sep. 22, 2011

(65) Prior Publication Data
US 2012/0020178 A1   Jan. 26, 2012

Related U.S. Application Data

(60) Division of application No. 13/019,785, filed on Feb. 2, 2011, now Pat. No. 8,050,134, which is a continuation of application No. 12/391,873, filed on Feb. 24, 2009, now Pat. No. 7,907,470, which is a continuation of application No. 11/853,708, filed on Sep. 11, 2007, now Pat. No. 7,505,356, which is a continuation of application No. 10/955,193, filed on Sep. 30, 2004, now Pat. No. 7,280,428.

(51) Int. Cl.
*G11C 8/14* (2006.01)
*G06F 5/76* (2006.01)

(52) U.S. Cl. ......... 365/230.06; 365/189.04; 365/230.03; 365/233; 711/5; 711/168; 345/519; 345/545; 345/567

(58) Field of Classification Search ............... 711/5, 168; 365/189.04, 230.03, 230.06, 233; 345/519, 345/545, 567
See application file for complete search history.

(56) References Cited

U.S. PATENT DOCUMENTS
4,377,855 A   3/1983   Lavi ................................ 365/49
(Continued)

FOREIGN PATENT DOCUMENTS
EP   0887737 A2   12/1998
(Continued)

OTHER PUBLICATIONS

Yoon, Hongil, et al., "A 2.5V 333Mb/pin 1Gb Double Data Rate SDRAM," ISSCC Digest of Technical Papers, pp. 412-413, Feb. 17, 1999.
(Continued)

*Primary Examiner* — John Lane

(57) ABSTRACT

A memory system includes a master device, such as a graphics controller or processor, and an integrated circuit memory device operable in a dual column addressing mode. The integrated circuit memory device includes an interface and column decoder to access a row of storage cells or a page in a memory bank. During a first mode of operation, a first row of storage cells in a first memory bank is accessible in response to a first column address. During a second mode of operation, a first plurality of storage cells in the first row of storage cells is accessible in response to a second column address during a column cycle time interval. A second plurality of storage cells in the first row of storage cells is accessible in response to a third column address during the column cycle time interval. The first and second pluralities of storage cells are concurrently accessible from the interface.

39 Claims, 11 Drawing Sheets

U.S. PATENT DOCUMENTS

| | | | |
|---|---|---|---|
| 4,542,483 A | 9/1985 | Procyk | 365/190 |
| 4,569,036 A | 2/1986 | Fujii | 365/230 |
| 4,636,982 A | 1/1987 | Takemae et al. | 365/149 |
| 4,646,268 A | 2/1987 | Kuno | 365/179 |
| 4,670,745 A | 6/1987 | O'Malley et al. | 340/801 |
| 4,698,788 A | 10/1987 | Flannagan | 365/205 |
| 4,700,328 A | 10/1987 | Burghard | 365/51 |
| 4,710,902 A | 12/1987 | Pelley, III | 365/222 |
| 4,740,921 A | 4/1988 | Lewandowski | 365/189 |
| 4,758,993 A | 7/1988 | Takemae | 365/222 |
| 4,766,538 A | 8/1988 | Miyoshi | 364/200 |
| 4,768,157 A | 8/1988 | Chauvel et al. | 364/521 |
| 4,787,858 A | 11/1988 | Killian, Jr. | 439/350 |
| 4,796,230 A | 1/1989 | Young | 365/189 |
| 4,800,525 A | 1/1989 | Shah | 365/72 |
| 4,811,302 A | 3/1989 | Koishi | 365/222 |
| 4,825,413 A | 4/1989 | Tran | 365/189 |
| 4,837,465 A | 6/1989 | Rubinstein | 307/530 |
| 4,837,743 A | 6/1989 | Chiu | 371/51 |
| 4,843,264 A | 6/1989 | Galbraith | 307/530 |
| 4,862,421 A | 8/1989 | Tran | 365/189.07 |
| 4,888,732 A | 12/1989 | Inoue | 365/51 |
| 4,903,344 A | 2/1990 | Inoue | 365/51 |
| 4,961,168 A | 10/1990 | Tran | 365/189.11 |
| 4,982,370 A | 1/1991 | Matsumoto | 365/222 |
| 4,984,196 A | 1/1991 | Tran | 365/51 |
| 4,985,867 A | 1/1991 | Ishii et al. | 365/221 |
| 4,991,141 A | 2/1991 | Tran | 365/207 |
| 5,046,050 A | 9/1991 | Kertis | 365/208 |
| 5,093,806 A | 3/1992 | Tran | 365/189.11 |
| 5,111,434 A | 5/1992 | Cho | 365/207 |
| 5,119,340 A | 6/1992 | Slemmer | 365/230.03 |
| 5,121,358 A | 6/1992 | Slemmer | 365/266 |
| 5,124,610 A | 6/1992 | Conley | 310/303 |
| 5,124,951 A | 6/1992 | Slemmer | 365/230.06 |
| 5,128,897 A | 7/1992 | McClure | 365/230.06 |
| 5,132,931 A | 7/1992 | Koker | 365/210 |
| 5,146,592 A | 9/1992 | Pfeiffer et al. | 395/157 |
| 5,150,330 A | 9/1992 | Hag | 365/230.03 |
| 5,181,205 A | 1/1993 | Kertis | 371/21.1 |
| 5,193,072 A | 3/1993 | Frenkil | 365/222 |
| 5,193,074 A | 3/1993 | Anami | 365/230.03 |
| 5,214,610 A | 5/1993 | Houston | 365/235.3 |
| 5,222,047 A | 6/1993 | Matsuda et al. | 365/230.03 |
| 5,241,503 A | 8/1993 | Cheng | 365/205 |
| 5,249,165 A | 9/1993 | Toda | 365/189.04 |
| 5,251,178 A | 10/1993 | Childers | 365/227 |
| 5,263,002 A | 11/1993 | Suzuki et al. | 365/230.05 |
| 5,267,215 A | 11/1993 | Tsujimoto | 365/230.03 |
| 5,274,596 A | 12/1993 | Watanabe | 365/203 |
| 5,291,444 A | 3/1994 | Scott | 365/189.05 |
| 5,301,162 A | 4/1994 | Shimizu | 365/230.03 |
| 5,305,280 A | 4/1994 | Hayano | 365/230.03 |
| 5,321,646 A | 6/1994 | Tomishima | 365/51 |
| 5,337,283 A | 8/1994 | Ishikawa | 365/222 |
| 5,343,438 A | 8/1994 | Choi | 365/233 |
| 5,383,159 A | 1/1995 | Kubota | 365/207 |
| 5,390,308 A | 2/1995 | Ware | 395/400 |
| 5,394,528 A | 2/1995 | Kobayashi et al. | 395/325 |
| 5,406,526 A | 4/1995 | Sugibayashi | 365/230.03 |
| 5,414,662 A | 5/1995 | Foss | 365/203 |
| 5,418,737 A | 5/1995 | Tran | 365/203 |
| 5,428,389 A | 6/1995 | Ito | 348/231 |
| 5,432,743 A * | 7/1995 | Kusakari | 365/196 |
| 5,455,802 A | 10/1995 | McClure | 365/233 |
| 5,471,425 A | 11/1995 | Yumitori | 365/190 |
| 5,485,430 A | 1/1996 | McClure | 365/233 |
| 5,517,456 A | 5/1996 | Chishiki | 365/230.03 |
| 5,530,814 A | 6/1996 | Wong et al. | 395/312 |
| 5,546,346 A | 8/1996 | Agata et al. | 365/203 |
| 5,559,970 A | 9/1996 | Sharma | 395/312 |
| 5,587,960 A | 12/1996 | Ferris | 365/230.03 |
| 5,614,855 A | 3/1997 | Lee | 327/158 |
| 5,652,870 A | 7/1997 | Yamasaki et al. | 395/500 |
| 5,655,113 A | 8/1997 | Leung et al. | 395/552 |
| 5,717,871 A | 2/1998 | Hsieh et al. | 395/250 |
| 5,717,901 A | 2/1998 | Sung et al. | 395/497.01 |
| 5,748,561 A | 5/1998 | Hotta | 365/238.5 |
| 5,751,657 A | 5/1998 | Hotta | 365/238.5 |
| 5,787,267 A | 7/1998 | Leung et al. | 395/482 |
| 5,793,998 A | 8/1998 | Copeland et al. | 395/201 |
| 5,801,985 A | 9/1998 | Roohparvar et al. | 365/185.01 |
| 5,852,725 A | 12/1998 | Yen | 395/282 |
| 5,893,927 A | 4/1999 | Hovis | 711/171 |
| 5,903,509 A | 5/1999 | Ryan | 365/230.03 |
| 5,933,387 A | 8/1999 | Worley | 365/230.03 |
| 5,936,885 A | 8/1999 | Morita et al. | 365/185.09 |
| 5,958,033 A | 9/1999 | Schubert et al. | 710/126 |
| 5,963,488 A * | 10/1999 | Inoue | 365/200 |
| 6,034,878 A | 3/2000 | Osaka et al. | 365/52 |
| 6,047,347 A | 4/2000 | Hansen et al. | 710/127 |
| 6,075,728 A | 6/2000 | Inoue | 698/189.01 |
| 6,125,157 A | 9/2000 | Donnelly | 375/371 |
| 6,138,185 A | 10/2000 | Nelson et al. | 710/33 |
| 6,141,273 A | 10/2000 | Ku et al. | 365/201 |
| 6,144,220 A | 11/2000 | Young et al. | 326/41 |
| 6,240,039 B1 | 5/2001 | Lee et al. | 365/230.06 |
| 6,247,084 B1 | 6/2001 | Apostol et al. | 710/108 |
| RE37,409 E | 10/2001 | Richardson | 365/230.03 |
| 6,311,313 B1 | 10/2001 | Camporese et al. | 716/6 |
| 6,366,995 B1 | 4/2002 | Vilkov et al. | 711/206 |
| 6,393,543 B1 | 5/2002 | Vilkov et al. | 711/202 |
| 6,587,917 B2 | 7/2003 | Simmons | 711/105 |
| 6,625,687 B1 | 9/2003 | Halbert et al. | 711/105 |
| 6,680,736 B1 * | 1/2004 | Cho | 345/519 |
| 6,754,120 B1 | 6/2004 | Bellows | 365/205 |
| 6,825,841 B2 | 11/2004 | Hampel | 345/519 |
| 7,281,079 B2 | 10/2007 | Bains et al. | 711/5 |
| 2001/0037428 A1 | 11/2001 | Hsu | 711/105 |
| 2003/0052885 A1 | 3/2003 | Hampel | 345/501 |
| 2003/0174573 A1 | 9/2003 | Suzuki et al. | 365/230.03 |
| 2004/0019756 A1 | 1/2004 | Perego | 711/170 |
| 2004/0120197 A1 | 6/2004 | Kondo et al. | 365/202 |

FOREIGN PATENT DOCUMENTS

| | | |
|---|---|---|
| EP | 1248267 A | 10/2002 |
| GB | 2367400 A | 4/2002 |
| WO | WO 91-16680 | 10/1991 |

OTHER PUBLICATIONS

Yoo et al., "17.7: A 1.8V 700Mb/s/pin 512Mb DDR-II SDRAM with On-Die Termination and Off-Chip Driver Calibration", ISSCC, Feb. 2003, pp. 312-313/495/250-251.

Ware, Frederick A., Rambus, Inc., "Direct RDRAM 256/288-Mbit (512Kx16/18x32s) Data Sheet," Preliminary Information, Document DL0060 Version 0.90, 1999, pp. 1-66.

Nvidia Corporation, Technical Brief, "GeForce3: Lightspeed Memory Architecture," pp. 1-9.

Zhao, Cansang, TA 11.6 "An 18Mb, 12.3GB/s CMOS Pipeline-Burst Cache SRAM with 1.54Gb/pin," Zhao, et al. IEEE International Solid-State Circuits Conference, 1999. 10 pages.

"The Authoritative Dictionary of IEEE Standards Terms," Copyright 2000, IEEE Press, Seventh Edition, p. 252.

Satoh et al., "A 209K-Transistor ECL Gate Array with RAM," IEEE Journal of Solid-State Circuits, vol. 24, No. 5, Oct. 1989, pp. 1275-1281.

"Memory CMOS 8 x 256K x 32 Bit Double Data Rate FCRAM, MB81N643289-50/-60," pp. 1-56, Fujitsu Semiconductor Data Sheet, Advance Info., AE0.5E.

Sugibayashi, Tadahiki et al., "WP3.5: A 30ns 256Mb DRAM with Multi-Divided Array Structure", ISSCC Feb. 1993, pp. 50-51/262.

Saeki, Takanori, et al., "SP 23.4: A 2.5 ns Clock Access 250MHz 256Mb SDRAM with a Synchronous Mirror Delay," IEEE ISSCC Digest of Technical Papers, p. 374-375, 476, Feb. 10, 1996.

Yoo, Hoi-Jun et al., "FA14.4: A 150MHz 8-Banks 256M Synchronous DRAM with Wave Pipelining Methods", ISSCC, Feb. 1995, pp. 250-251/374.

Yamashita, Nobuyuki et al., "FA 15.2: A 3.84 GIPS Integrated Memory Array Processor LSI with 64 Processing Elements and 2-Mb SRAM", IEEE International Solid-State Circuit Conference, pp. 260-261, Feb. 1994.

Micron, "Graphics DDR3 DRAM." Advance. "256 Mb x 32 GDDR3 DRAM." © 2003 Micron Technology, Inc. pp. 1-67.

"Design Optimization Techniques for Double Data Rate SDRAM Modules," Fairchild Semiconductor, Jul. 2000, 6 pages.

Nitta, Yasuhiko, et al., "SP23.5: A 1.6GB/s Data-Rate 1Gb Synchronous DRAM with Hierarchical Square-Shaped Memory Block & Distributed Bank Architecture", IEEE ISSCC Digest of Technical Papers, p. 376-377, 477, Feb. 10, 1996.

Masumoto, Rodney T., "Configurable On-Chip RAM Incorporated Into High Speed Logic Array," Proceedings of the IEEE 1985 Custom Integrated Circuits Conference, May 20-23, 1985, pp. 240-243.

International Search Report and Written Opinion of the International Searching Authority in International Application PCT/US2005/032770, World Intellectual Property Organization, Jan. 26, 2006, 12 pages (RBS2.P034W0).

Sugibayashi et al., "A 30-ns 256-Mb DRAM with a Multidivided Array Structure", IEEE, Nov. 1993, pp. 1092-1098, vol. 28, No. 11.

Aimoto, Yashiharu, et al., "SP23.3 A 7168GIPS 3.84GB/s 1W Parallel Image-Processing RAM Integrating a 16Mb DRAM and 128 Processors", ISSCC, Feb. 1996, pp. 372-373/476.

"DRAM Data Book," Micron Technology, Inc. Preliminary 1997. 3 pgs. Cover/copyright info./listing of chapters, i-xxiv, 2 pages, 1-1 to 1-44 (71 pages).

Takase, Satoru and Kushiyama, Natsuki, "A 1.6-Gbyte/s DRAM with Flexible Mapping Redundancy Technique and Additional Refresh Scheme," IEEE Journal of Solid-State Circuits, vol. 34, No. 11, Nov. 1999, pp. 1600-1606.

Chang, Kun-Yung "Design of a CMOS Asymmetric Serial Link" A Dissertation Submitted to the Department of Electrical Engineering and the Committee on Graduate Studies of Stanford University Aug. 1999, 133 pages.

Yoo, Jei-Hwan et al., "SP23.6 A 32-Bank 1Gb DRAM with 1GB/s Bandwidth", ISSCC,s Feb. 1996, pp. 378-379/477.

Giacalone et al., "SP23.2: A 1MB, 100MHz Integrated L2 Cache Memory with 128b Interface and ECC Protection," IEEE ISSCC, Feb. 1996, pp. 370-371/475.

Samsung Electronics, "SDRAM Device Operations", date unknown.

Sakata et al., "Two-Dimensional Power-Line Selection Scheme for Low Subthreshold-Current Multi-Gigabit DRAM's", IEEE Journal of Solid State Circuits, vol. 29, No. 8, Aug. 1994, pp. 887-893.

International Search Report and Written Opinion of the International Searching Authority in International Application PCT/US2005/028728, World Intellectual Property Organization, Dec. 23, 2005 (RBS2.P033WO).

Konishi, Saisohi, et al., "Session SVIII: Static RAMs—FAM18.6: A 64Kb COMOS RAM", ISSCC, Feb. 1982, pp. 258-259/333.

Koike, Hiroke et al., "SP23.1: A 60ns 1Mb Nonvolatile Ferroelectric Memory with Non-Driven Cell Plate Line Write/Read Scheme", ISSCC, Feb. 1996, pp. 368-379/475.

Kirihata et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588.

Minutes of Meeting No. 70, JC-42.3 Committee on RAM Memories, Mar. 9, 1994, Orlando, Florida, 72 pages (see, in particular, p. 62).

Micron Technology Inc., "Micron Synchronous DRAM 128Mb:x32 SDRAM," pp. 1-52, Rev. 9/00.

Nakamura, Masayuki, et al., "FA14.2: A 29ns 64Mb DRAM with Hierarchical Array Architecture", ISSCC, Feb. 1995, pp. 246-247/373. 3 pages.

Hirose, Toshihiko, et al., "A 20-ns 4-Mb CMOS SRAM with Hierarchical Word Decoding Architecture", IEEE, Oct. 1990, pp. 1068-1072, vol. 25, No. 5.

Takase, Satoru and Natuski Kushiyama, "WP 24.1 A 1.6GB/s DRAM with Flexible Mapping Redundancy Technique and Additional Refresh Scheme," ISSCC99/Session 24/Paper, Toshiba Corp., WP 24.1, Feb. 17, 1999, 2 pages.

JEDEC, "Minutes of Meeting No. 71, JC-42.3 Committee on RAM Memories, including Proposal to Add Number of Banks Option to the Mode Register for 64M SDRAM," Joint Electron Device Engineering Council (JEDEC), May 25, 1994, New York, pp. 1-14 plus Attachment T.

International Preliminary Report on Patentability and Written Opinion of the International Searching Authority in International Application PCT/US2005/042722, World Intellectual Property Organization, Jun. 7, 2007, 10 pages.

International Preliminary Report and Written Opinion of the International Searching Authority in International Application PCT/US/2005/032770, World Intellectual Property Organization, Apr. 12, 2007, 6 pages. (RBS2.P034WO).

Takase, Satoro and Kushiyama, Natsuki, "WP 24.1 A 1.6GB/s DRAM with Flexible Mapping Redundancy Technique and Additional Refresh Scheme," IEEE International Solid-State Circuits Conference, 4 pages plus ISSCC Slide Supplement pp. 348-349 and 506-507, 1999.

Notice of Allowance and Fee(s) dated Aug. 31, 2010, in U.S. Appl. No. 12/391,873, filed Feb. 24, 2009. 10 pages.

Information Disclosure Statement and RCE dated Sep. 29, 2010, re: U.S. Appl. No. 12/391,873. 5 pages.

Communication Regarding the Expiry of the Time Limit Within Which Notice of Opposition May be Filed, dated Sep. 15, 2010 in EP Application No. 05799571.4-2210. 1 page.

Notice of Allowance and Fee(s) Due with mail date of Nov. 3, 2010, re U.S. Appl. No. 12/391,873, includes Information Disclosure Statements. 11 Pages.

* cited by examiner

MULTI-COLUMN ADDRESSING MODE MEMORY SYSTEM INCLUDING AN INTEGRATED CIRCUIT MEMORY DEVICE

CROSS-REFERENCE TO RELATED APPLICATIONS

This application is a divisional of U.S. patent application Ser. No. 13/019,785, filed Feb. 2, 2011 (now U.S. Pat. No. 8,050,134), which is a continuation of U.S. patent application Ser. No. 12/391,873, filed Feb. 24, 2009 (now U.S. Pat. No. 7,907,470), which is a continuation of U.S. patent application Ser. No. 11/853,708 (now U.S. Pat. No. 7,505,356), which is a continuation of U.S. patent application Ser. No. 10/955,193 (now U.S. Pat. No. 7,280,428), each entitled "Multi-Column Addressing Mode Memory System Including an Integrated Circuit Memory Device." Each of these earlier applications and patents are hereby incorporated by reference.

FIELD OF THE INVENTION

The present invention relates to high speed signaling.

BACKGROUND

A memory system typically includes a master device, such as a memory controller or graphics controller, and a plurality of integrated circuit memory devices for storing data. An integrated circuit memory device typically includes a plurality of storage cells for storing data, such as pixel information. The plurality of storage cells may be arranged in an array or memory bank. The integrated circuit memory device may include a plurality of memory banks.

Data is written to and read from the integrated circuit memory device in response to one or more commands included in read and/or write transactions between the integrated circuit memory device and the master device. For example, data is generally transferred from memory banks to sense amplifiers in response to an ACTIVATION (ACT) command on a control interconnect. The data may then be transferred from the sense amplifiers thru an integrated circuit memory device interface and onto a data interconnect in response to a READ (RD) command on the control interconnect.

Data stored in the plurality of storage cells is typically transferred to the sense amplifiers one row of storage cells at a time. A row of storage cells is typically referred to as "a page". A column address is often provided to an integrated circuit memory device by the master device to access data within a selected page. A column address may be included in a request packet or with a command provided by the master device to the integrated circuit memory device.

Memory systems are utilized in different manners depending upon whether the memory system is used for a computational application, such as a general-purpose computer, or graphics application, such as a game console. For example in a graphics application, a large portion of memory requests by a graphics controller, have small transfer sizes of 16 to 32 bytes and little spatial or temporal locality. This is because even though the image itself is large, the polygon fragments that make up the image are small, getting smaller over time, and are stored with little relation to each other. Only a small portion of a page may need to be accessed in rendering a current image in a graphics application. In contrast, computational applications may have 256 byte cache line block transactions. In a computational application, a control interconnect or bus is often shared across multiple integrated circuit memory devices; where a control bus is often dedicated to each integrated circuit memory device in a graphics application. In computational applications, address mapping is typically random across multiple memory banks; while address mapping is generally limited to pages of an integrated circuit memory device in graphics applications. Transaction queues in the master device are reordered to minimize memory bank conflicts in both computational applications and graphics applications, but also reordered to maximize memory bank hits in a graphics application. In a computational application, there are generally a limited number of outstanding read transactions in the transaction queue, for example 10; while there may be hundreds of transactions in a graphics application.

Memory systems in a graphics application have accommodated the need for small transfer granularity by having more transfers (reducing a column cycle time interval $t_{CC}$.) However, this will cause the cost of the integrated memory circuit device to increase, since the performance of the memory core that contains the interface to the sense amplifiers will likely have to increase as well. In any case, this is an inefficient solution because the size of each transfer remains the same; the unused portion of the data fetched remains the same.

BRIEF DESCRIPTION OF THE DRAWINGS

FIG. 4 is a request packet format having two column addresses for a row of storage cells (or page) of the integrated circuit memory device shown in FIG. 1.

FIG. 8 illustrates request packet formats having four column addresses for quad column addressing mode of the integrated circuit memory device shown in FIG. 1.

DETAILED DESCRIPTION

A memory system includes a master device, such as a graphics controller or memory controller, and at least one integrated circuit memory device operable in a dual or multi-column addressing mode. The integrated circuit memory device includes, among other circuit components, an interface and column decoder to access a row of storage cells or a page in a memory bank. During a first mode of operation, a first row of storage cells in a first memory bank is accessible in response to a first column address. During a second mode of operation, a first plurality of storage cells in the first row of storage cells is accessible in response to a first column address during a column cycle time interval. A second plurality of storage cells in the first row of storage cells is accessible in response to a second column address during the column cycle time interval. During a third mode of operation, a first plurality of storage cells in a first row of storage cells in a first memory bank is accessible in response to a first column address. A second plurality of storage cells in a second row of storage cells in a second bank is accessible in response to a second column address. A third plurality of storage cells in the first row of storage cells is accessible in response to a third column address and a fourth plurality of storage cells in the second row of storage cells is accessible in response to a fourth column address. The first and second column addresses are in a first request packet and the third and fourth column addresses are in a second request packet provided by the master device.

Figure 1:
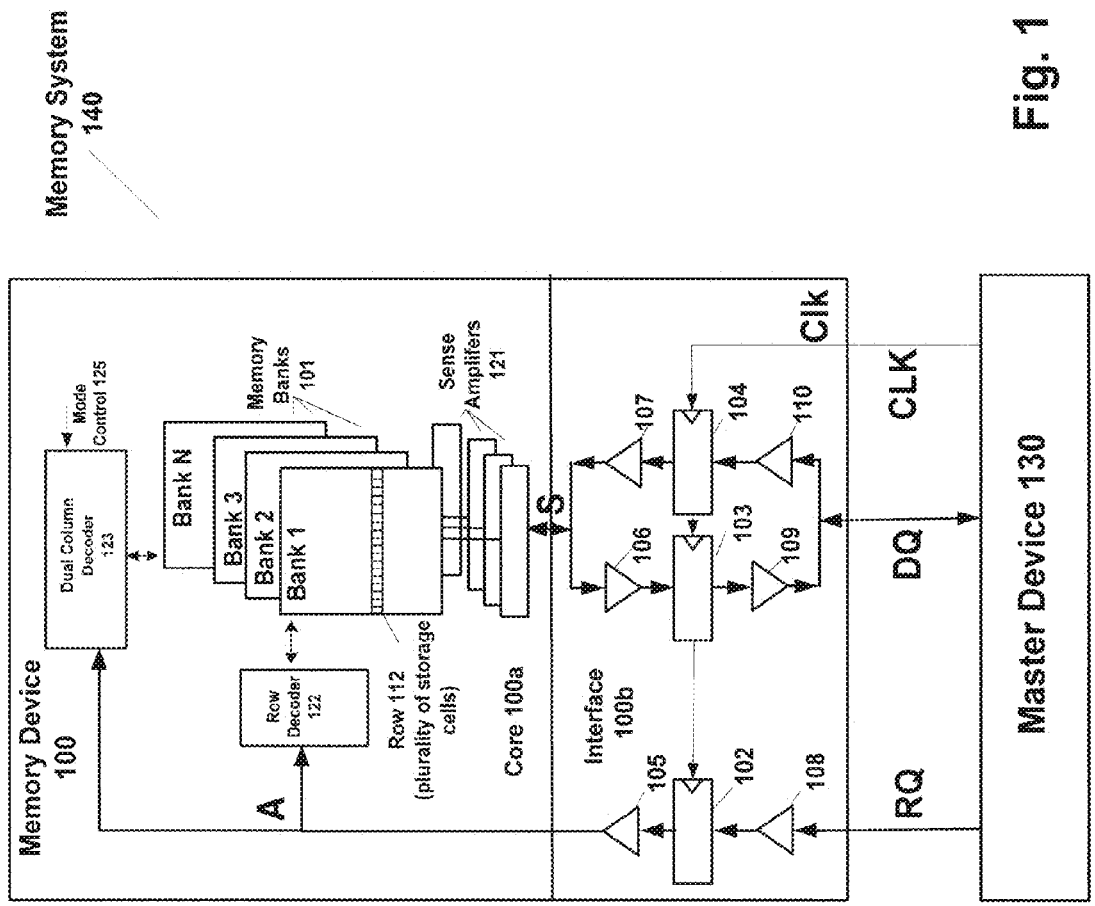
FIG. 1 is a simplified block diagram of a memory system including an integrated circuit memory device and master device.

FIG. 1 illustrates a memory system 140 including an integrated circuit memory device 100 coupled to master device 130 by interconnects RQ and DQ. Integrated circuit memory device 100 includes N memory banks 101, in a memory core 100a, and an interface 100b.

Memory banks 101 include individual memory banks having a two dimensional array of storage cells. In an embodiment, memory banks 101 include 16 memory banks. In an embodiment, a memory bank includes 2048 rows of storage cells or pages. Each row includes 64 addressable columns that each store 16 bytes of information (or 1024 bytes per page). In embodiments, storage cells of memory banks 101 may be dynamic random access memory (DRAM) cells, static random access memory (SRAM) cells, read-only memory (ROM) cells, or other equivalent types of memory storage cells. In an embodiment, integrated circuit memory device 100 is an XDR™ DRAM integrated circuit memory device provided by Rambus Inc. of Los Altos, Calif., USA.

Reading and writing to memory banks 101 are initiated by row decoder 122 and dual column decoder 123 in response to row and column addresses, respectively. A plurality of storage cells or referred to as row 112 (also referred to as a page) outputs a plurality of data (or set of data) to sense amplifiers 121 in response to a row address provided to row decoder 122 followed by a column address or column addresses provided to dual column decoder 123 on internal interconnect A. Memory device 100 includes an internal interconnect A for providing control and address signals for addressing a storage location in memory banks 101. Interconnect A is coupled to circuitry 105 for coupling interface 100b to core 100a. Pipeline register 102 is coupled to circuitry 105 and receiver 108. External interconnect RQ is coupled to receiver 108 and carries external control and address signals between interface 100b and master device 130. In an embodiment, interconnect RQ is a twelve signal line unidirectional control/address bus. Internal interconnect S, in an embodiment, is an internal bidirectional bus for providing read/write data signals between sense amplifiers 121 memory banks 101. Interconnect S is coupled to circuitry 106 and 107 for coupling interface 100b to core 100a. Pipeline registers 103 and 104 are coupled to circuitry 106 and 107, respectively. Transmitter 109 and receiver 110 are coupled to pipeline registers 103 and 104, respectively. An external interconnect DQ transfers external bidirectional read/write data signals and is coupled to transmitter 109 and receiver 110 as well as master device 130. In an embodiment, interconnect DQ is a sixteen signal line bidirectional data bus.

Dual column decoder 123 allows independent access to one or more addressable columns in a selected row 112 during a column cycle time interval $t_{CC}$ in response to one or more column addresses provided on internal interconnect A. In an embodiment, dual column decoder 123 is initialized to a single, dual, quad or multiple columns addressing mode decoder in response to a mode control signal 125. In an embodiment, mode control signal 125 is provided from an initialization register at memory system 140 initialization or power-up. In an alternate embodiment, mode control signal 125 is provided by master device 130 by way of interconnect RQ and internal interconnect A at initialization or during typical operation.

The pipeline registers 102, 103, and 104 are used for synchronization of the information between the internal and external interconnects. Registers 102-104 may also be used for generating delay, as would be required if the internal and external interconnects used a different number of signals. Although memory device 100 shows a single level (clock cycle) of pipeline registers, two or more levels (clock cycles) of delay are used in alternative embodiments.

In an embodiment, differential signals are transferred between memory device 100 and master device 130 on interconnect RQ, interconnect DQ and a CLOCK (CLK) line.

A CLK line provides a clock signal Clk to registers 102-104 for synchronizing integrated circuit memory device 100 transactions. In an embodiment, a clock signal Clk is provided to integrated circuit memory device 100 by master device 130. In alternate embodiments, a clock signal Clk is provided by another source, such as a clock generator. In other embodiments, a clock signal Clk serves as a reference for a clock recovery circuit component, which generates the actual clocking signal used with integrated circuit memory device 100.

In an embodiment, interface 100b includes a plurality of conducting contacts, such as pins and/or balls, for coupling to interconnect RQ, interconnect DQ and one or more CLK lines. In an embodiment, interface 100b includes twelve pins for coupling to interconnect RQ and sixteen pins for coupling to interconnect DQ. As one of ordinary skill in the art would appreciate, more or less contacts may be provided in alternate embodiments.

In embodiments, interconnects described herein include a plurality of conducting elements or conducting paths such as a plurality of wires and/or metal traces/signal lines. In an embodiment, a single conducting path illustrated in the Figures may be replaced by multiple conducting paths and multiple signal paths illustrated in the Figures may be replaced by a single conducting path. In embodiments, an interconnect may include a bus and/or point-to-point connection. In an embodiment, interconnects include control and data signal lines. In an alternate embodiment, interconnects include only data lines or only control lines. In still other embodiments, interconnects are unidirectional (signals that travel in one direction) or bidirectional (signals that travel in two directions).

In embodiments, master device 130 is a general-purpose processor, memory controller, network controller or graphics processor.

In an embodiment, integrated circuit memory device 100 is positioned on a substrate in a memory module having multiple integrated circuit memory devices. In an alternate embodiment, master device 130, memory device 100 and associated interconnects are in an integrated monolithic circuit.

As one of ordinary skill in the art would appreciate, other embodiments of an integrated circuit memory device 100 and master device 130, singly or in combination are available.

Figure 2:
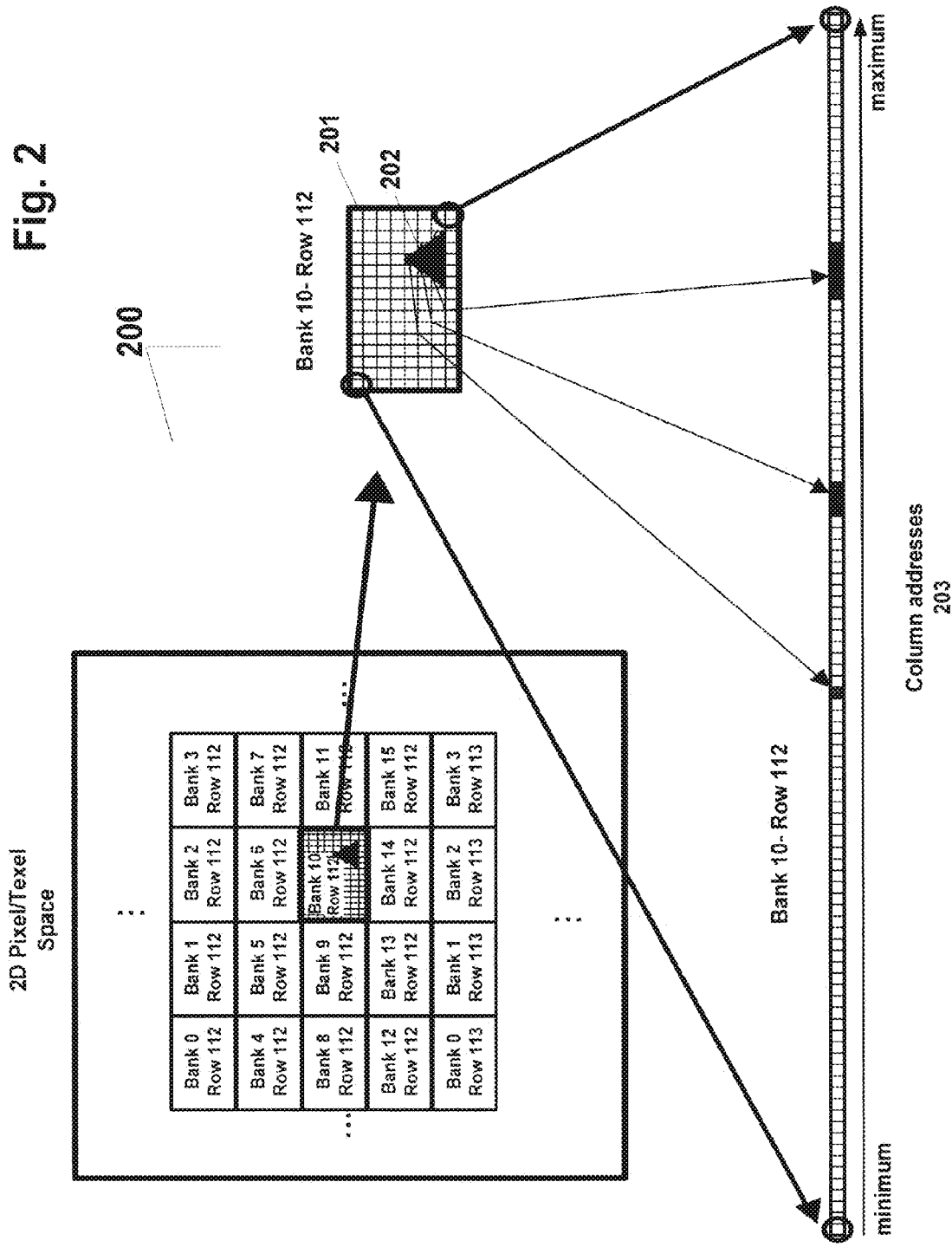
FIG. 2 illustrates pixel mapping of an integrated circuit memory device shown in FIG. 1.

FIG. 2 illustrates pixel-mapping 200 of an integrated circuit memory device 100 shown in FIG. 1. Pixel information or data stored in multiple memory banks are mapped to tiles of an image. In particular, a tile 201 or portion of an image, such as triangle 202, is stored in memory bank 10 at page or row 112 of storage cells. Pixel information and/or data for an image are stored in multiple banks and rows that are accessed to render an image on a display at a particular time. Column addresses 203 identify stored pixel information for rendering tile 201 and in particular an image of a triangle 202. As illustrated, if triangle 202 is rendered at a particular time, only portions or pixel information at a few particular column addresses of row 112 need to be accessed. Most of row 112 does not contain pixel information regarding triangle 202.

To reconstruct the image of triangle 202, multiple column addresses are provided to an integrated circuit memory device 100 for independently accessing portions of a row or page of storage cells during a column cycle time interval $t_{CC}$. Since each portion of the triangle that is to be retrieved is relatively small, it is desirable that small transfer granularities, or small transfer sizes per column address, be used for these types of graphics applications for the extensive rendering of images comprising small triangles. In particular memory device 100 includes a dual or generally multi-column decoder 123 that decodes one or more column addresses for accessing a plurality of storage cells in a row of a memory bank or page.

Figure 3:
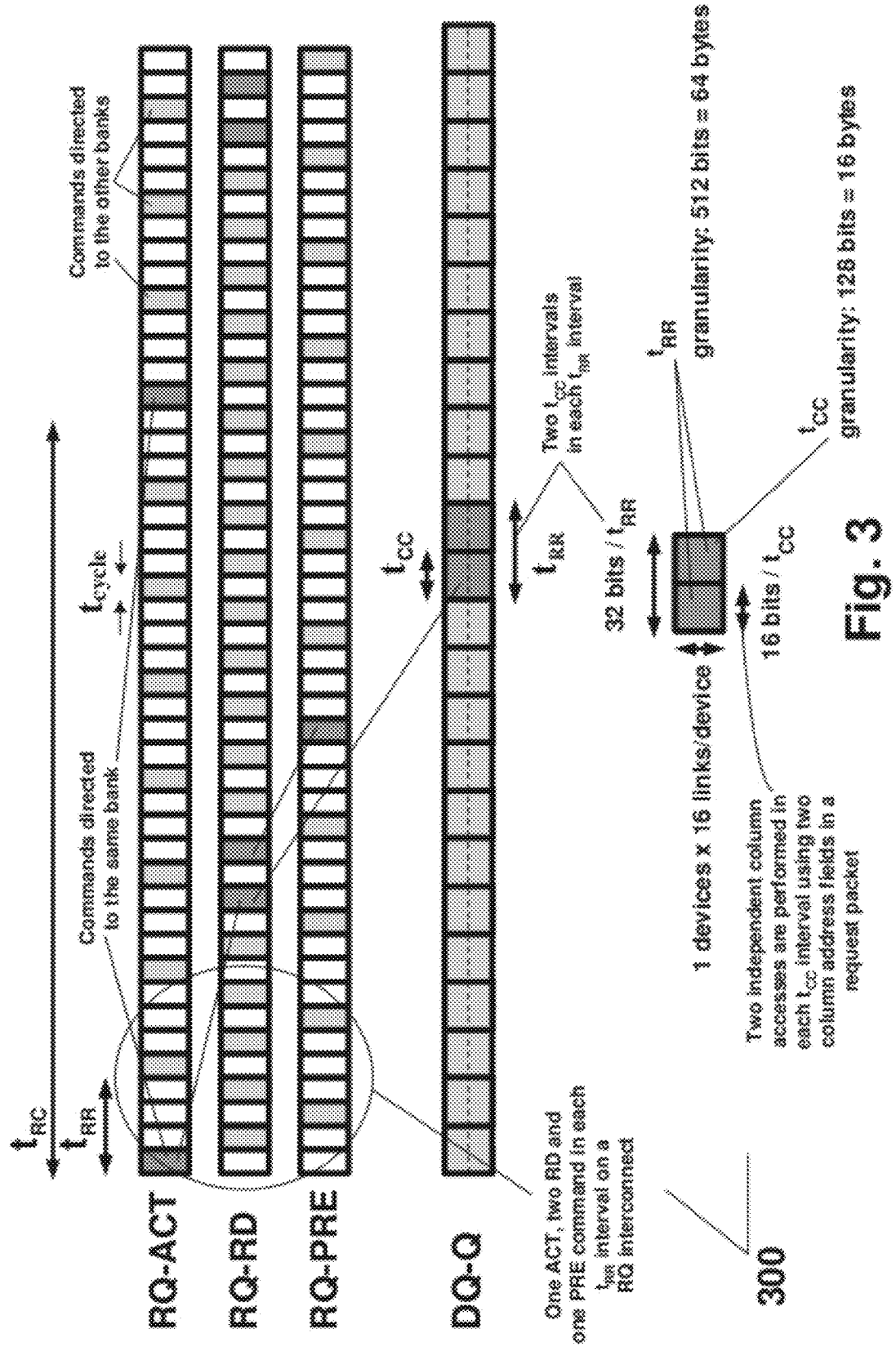
FIG. 3 is a timing diagram illustrating a first and second mode of operation using a single and dual column addressing mode, respectively, of the integrated circuit memory device shown in FIG. 1.
Figure 4:
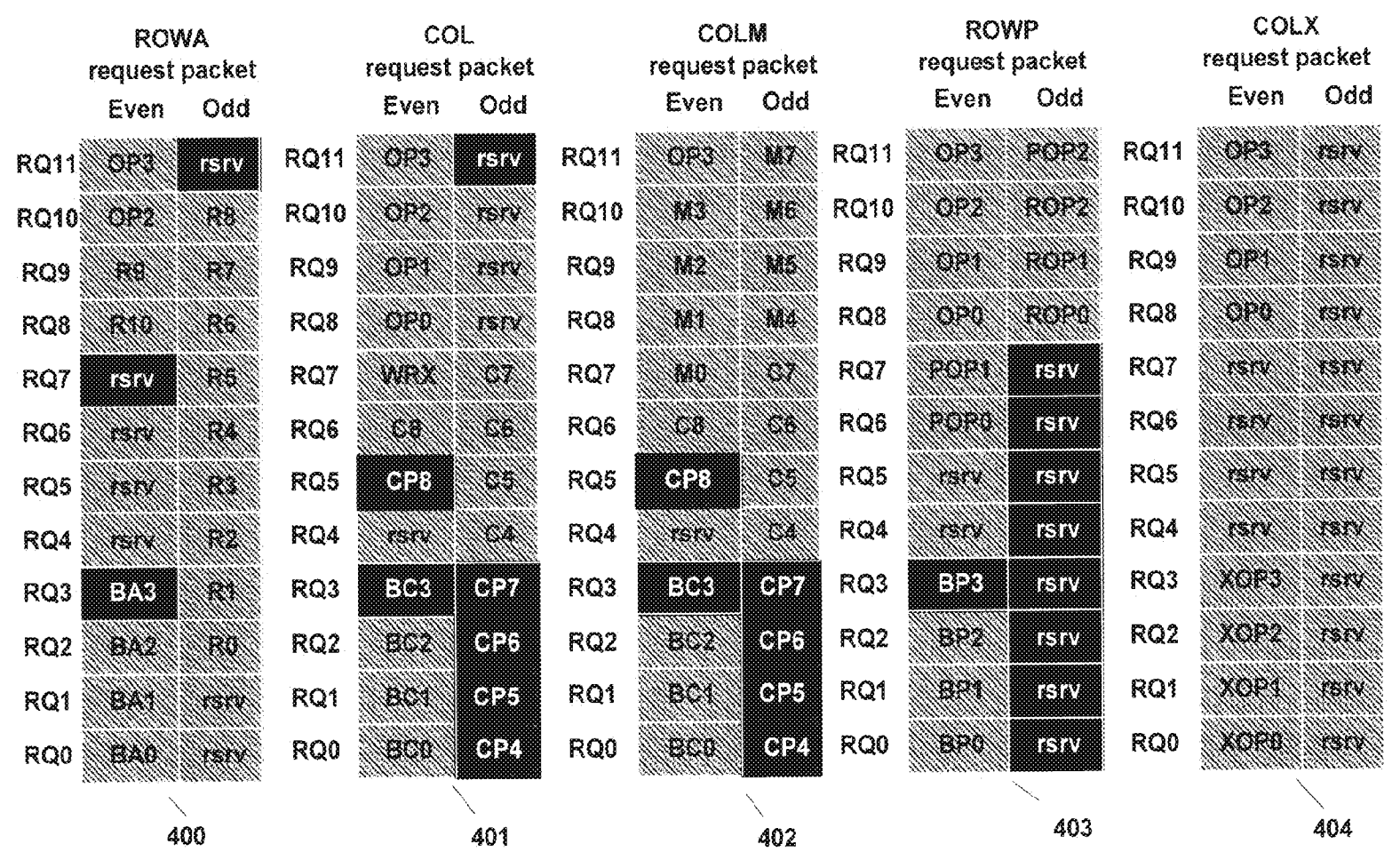

FIG. 3 is a timing diagram 300 illustrating a first mode of operation and a second mode of operation using dual column mode addressing of an integrated circuit memory device 100. Timing diagram 300, as well as other timing diagrams illustrated herein, provides various method embodiments of operating memory system 140, in particular integrated circuit memory device 100. One of ordinary skill in the art would appreciate that timing diagrams described herein may include other or less memory transactions in alternate embodiments. In an embodiment, a memory transaction between integrated circuit memory device 100 and master device 130 is a collection of request packets used to complete access to one or more memory banks. A request packet represents one or more signals asserted at particular bit windows on particular signal lines on interconnect RQ in an embodiment. Format embodiments of request packets are shown in FIG. 4 and described below.

While certain timing constraints are illustrated in FIG. 3, as one of ordinary skill in the art would appreciate, other timing constraints are possible in other embodiments. In an embodiment, a cycle time interval $t_{cycle}$ between clock edges of a clock signal is approximately 1.25 ns. A column cycle time interval $t_{CC}$ is defined as two cycle time intervals $t_{cycle}$ in an embodiment. A row cycle time interval $t_{RC}$ is an amount of time or time interval between successive ACT commands to the same memory bank of integrated circuit memory device 100. A time interval $t_{RR}$ is an amount of time to open a selected row/page consecutively from different memory banks of the integrated circuit memory device 100 or an amount of time or time interval between successive ACT commands to different memory banks. A column cycle time $t_{CC}$ is an amount of time or time interval between successive RD commands or between successive WRITE (WR) commands to the same memory bank or to different memory banks. There are two column cycle time intervals $t_{CC}$ for every time interval $t_{RR}$ in an embodiment.

In a first or a computational mode of operation (accessing a page using a single column address), one ACT command, one RD command and a PRECHARGE (PRE) command are asserted on interconnect RQ by master device 130 to integrated circuit memory device 100. Dual column decoder accesses a single column in row 112 responsive to a single column address. In this mode of operation, a mode control signal 125 has been asserted to dual column decoder 123 so that dual column decoder 123, operating as a single column decoder, decodes a single column address per each column cycle time interval $t_{CC}$. A single column address is included in a COL or COLM request packet that also include a RD or WR command and is transferred from master device 130 to integrated circuit memory device 100 in an embodiment. In an embodiment, a COLM request is a masked operation that is used with a WR command and not a RD command. In an alternate embodiment, either a COL or COLM request may be used with a RD command.

In a second or a graphics mode of operation (accessing a page using two column addresses), one ACT command, one RD command and a PRE command are also asserted on interconnect RQ by master device 130 to integrated circuit memory device 100. In an alternate embodiment, two RD commands are provided. Dual column decoder accesses a first and second column in row 112 responsive to two respective column addresses. In this mode of operation, a mode control signal 125 has been asserted to dual column decoder 123 so that dual column decoder 123 decodes two column addresses per each column cycle time interval $t_{CC}$. Two column addresses may be included in either a COL or COLM request packet, illustrated in FIG. 4 that also includes a RD or WR command and is transferred from master device 130 to integrated circuit memory device 100 in an embodiment. In an embodiment, additional bank bits may be included in a request packet to identify a particular memory bank or multiple memory banks (for example dual memory banks) that are accessed by respective dual column decoders. Thus, dual or multi-column addressing enables smaller data granularity since the data transfer size between integrated circuit memory device 100 and master device 130 remains the same but a first half of the data transferred is obtained at a first column address and a second half of the data transferred is obtained from a second column address.

In response to a request packet that includes two independent column addresses, in particular, column address values in fields CP[8:4] (first column address) and C[8:4] (second column address) in either COL request packet 401 and COLM request packet 402, 256 bits or 32 bytes are read onto interconnect DQ (or on sixteen signal lines of interconnect DQ) per column cycle time interval $t_{CC}$. In other words, 512 bits or 64 bytes are read onto interconnect DQ per time interval $t_{RR}$.

Figure 5:
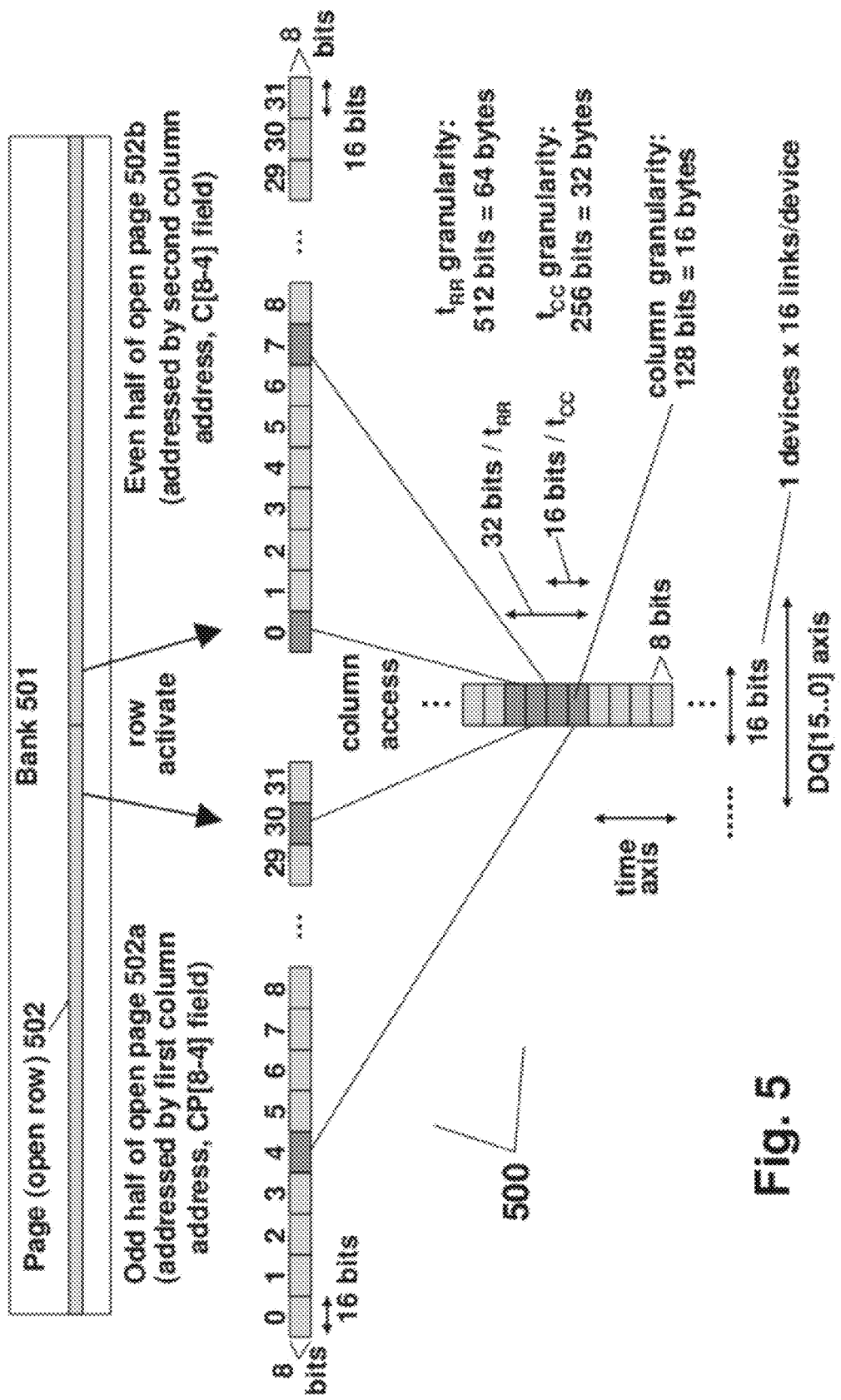
FIG. 5 illustrates a first time mapping from a page of the integrated circuit memory device to an external interconnect of the memory system shown in FIG. 1 using two column addresses.
Figure 6:
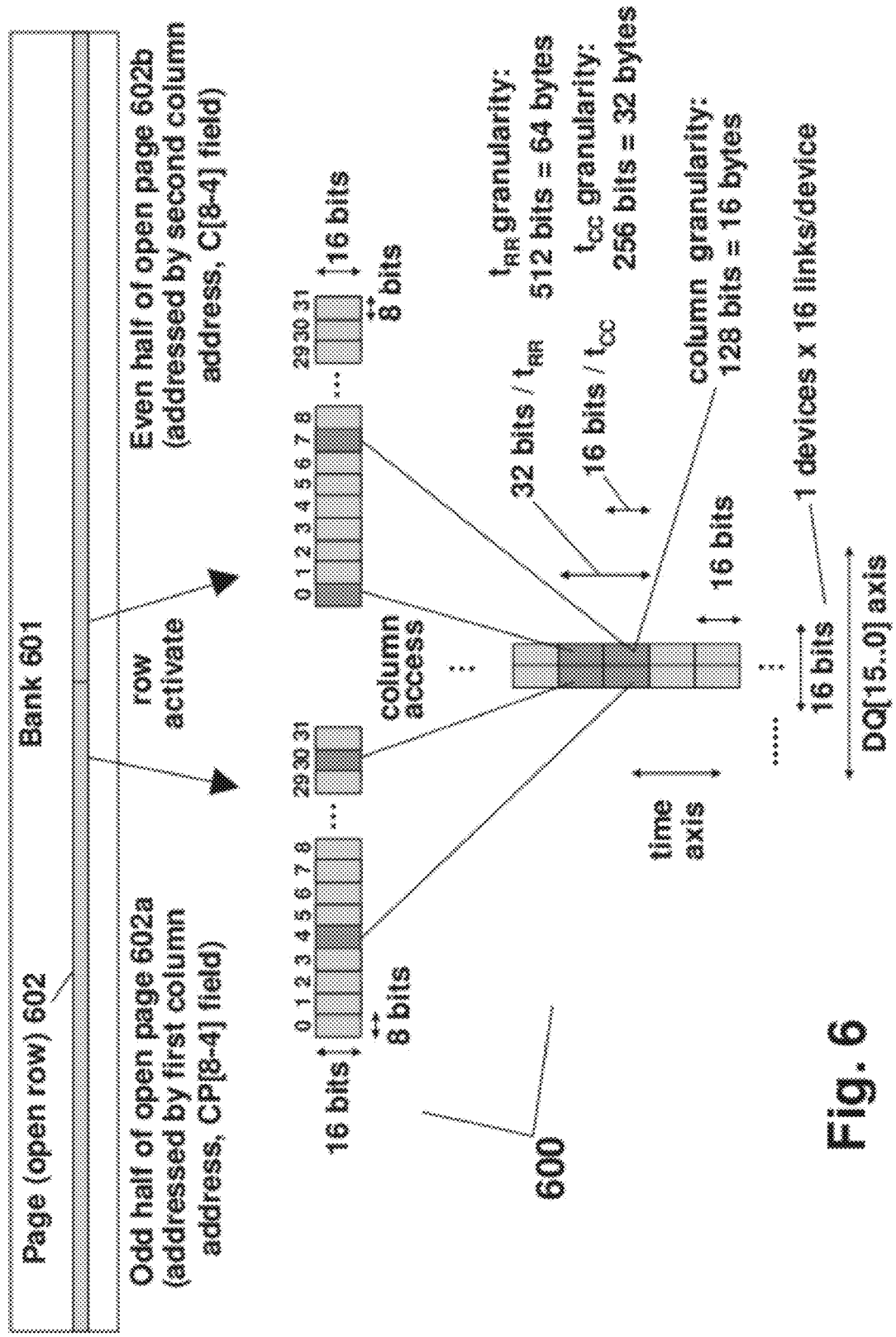
FIG. 6 illustrates a second time mapping from a page of the integrated circuit memory device to an external interconnect of the memory system shown in FIG. 1 using two column addresses.

FIGS. 5 and 6 illustrate a first time mapping 500 and second time mapping 600, respectively, from a page of the integrated circuit memory device 100 to an external interconnect DQ. FIG. 5 illustrates how page 502 of memory bank 501 can have a first half (or odd half of open page 502a) accessed responsive to a first column address value in a first column field CP[8:4] in a COL request packet 401 and a second half (or even half of open page 502b) accessed in response to a second address in a second column field C[8:4] in the same COL request packet 401 shown in FIG. 4. A COLM request packet 402 may likewise be used in an embodiment.

FIG. 5 illustrates how an interleaved 32 bytes per column cycle time $t_{CC}$ are output onto an interconnect DQ having 16 signal lines. A first 16 bits by 8 bits is obtained from an odd half of open page 502a and output on interconnect DQ and then a second 16 bits by 8 bits are obtained from an even half of open page 502b and output on interconnect DQ. In the embodiment illustrated by FIG. 5, a plurality of data is output from integrated circuit memory device 100 on interconnect DQ from interleaved odd and even halves of a page 502. Column granularity per column cycle time interval $t_{CC}$ is 128 bits or 16 bytes. Column granularity per time interval $t_{RR}$ is 512 bits or 64 bytes.

FIG. 6 illustrates how 32 bytes per column cycle time $t_{CC}$ from both halves of page 602 are simultaneously output on an interconnect DQ having 16 signal lines. A first 8 bits by 16 bits from an odd half of open page 602a and a second 8 bits by 16 bits from an even half of an open page 602b of open page 602 in memory bank 601 is output simultaneously on interconnect DQ in an alternate embodiment. Column granularity per column address remains the same at 128 bits or 16 bytes. Column granularity per column cycle time interval $t_{CC}$ is also 256 bits or 32 bytes in the embodiment illustrated by FIG. 6.

FIG. 4 illustrates formats of request packets 400-404, in particular request packets having two or more column addresses for accessing a page of an integrated circuit memory device 100. A request packet represents control and address signals, such as commands and column addresses, asserted by master device 130 on interconnect RQ to integrated circuit memory device 100 in an embodiment. Request packets consist of 24 bits or logical values that may be represented by voltage values provided on interconnect RQ (RQ0-RQ11 data signal lines) and sampled at interface 100b on two successive clock signal edges (indicated as "Even" and "Odd" in FIG. 4) in an embodiment. As one of ordinary skill in the art would appreciate, other request packets having different formats and/or sizes may be used in alternate embodiments.

Request packet formats 400-404 are distinguished by an opcode field (OP[X]), which specifies the opcode of a desired command. Reserved fields are identified by "rsrv".

ROWA request packet 400 has opcode fields OP[3:2] for an ACT command. A memory bank address field BA[3:0] and a row address field R[10:0] are also included for providing a bank address and a row address.

COL request packet 401 has opcode field OP[3:0] for a RD command and WR commands. A memory bank address field BC[3:0], a first column address field C[8:4] (for example, for accessing data in a column address of a page selected by the row address values in R[10:0]), a second column address field CP[8:4] (for example, for accessing data in a second column address of the page selected by the same row address values in R[10:0]) and a sub-opcode field (WRX) are specified for the RD and WR commands. In an embodiment, more than two column addresses may be included in a request packet for accessing more that two columns in a page during a column cycle time interval $t_{CC}$.

COLM request packet 402 has opcode field OP3 for a MASKED WRITE (WRM) command. A memory bank address field BC[3:0], a first column address field C[8:4], a second column address field CP[8:4], similar to COL request packet 401, and mask fields M[7:0].

ROWP request packet 403 has opcode fields OP[3:0] for PRE and REFRESH (REF) commands. A memory bank address field BP[3:0] and sub-opcode field POP[2:0] are specified for the PRE command. Sub-opcode fields ROP[2:0] are specified for a REF command.

COLX request packet 404 includes other opcode fields OP[3:0] and sub-opcode fields XOP[3:0].

Figure 7:
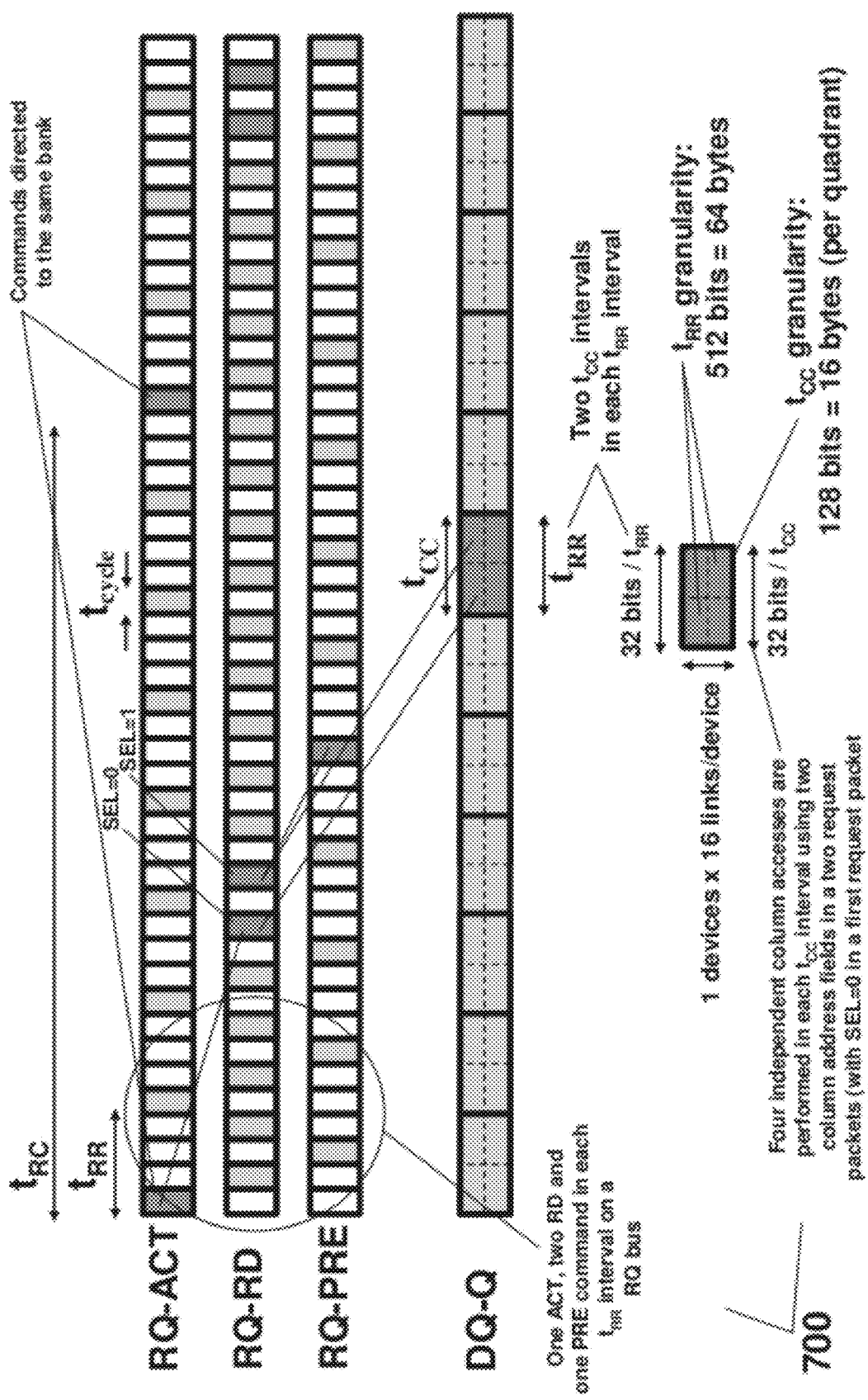
FIG. 7 is a timing diagram illustrating a third mode of operation using two dual column addresses or a quad column addressing mode of the integrated circuit memory device shown in FIG. 1.
Figure 9:
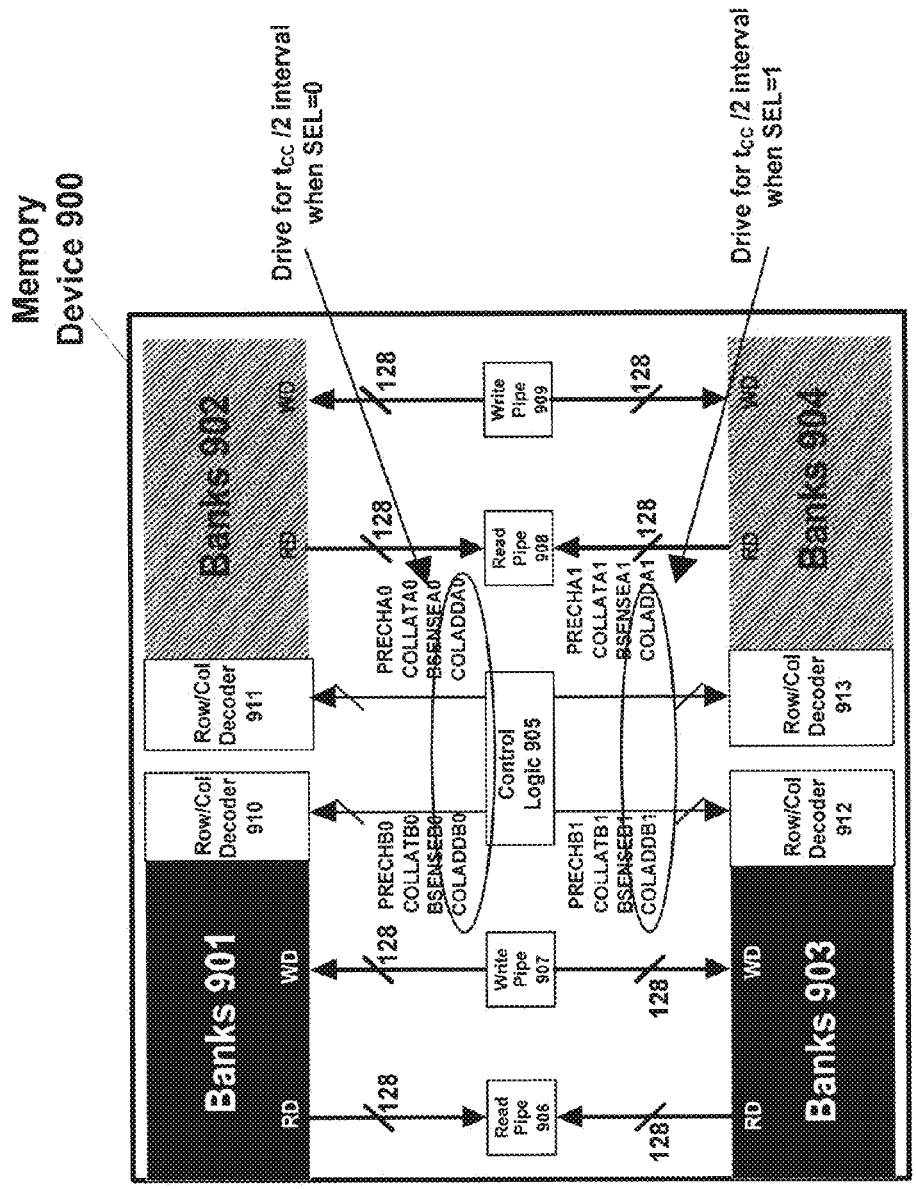
FIG. 9 is a simplified block diagram of the integrated circuit memory device that receives four column addresses for four independent column accesses of a page.

FIG. 7 illustrates a third time mapping 700 from a page of the integrated circuit memory device to an external interconnect DQ of the memory system shown in FIG. 1. FIG. 7 illustrates a time mapping similar to FIG. 3 except that four independent column accesses (quad), as compared to two (or dual) column accesses, are performed in each time interval $t_{CC}$ using four column addresses in two request packets. Please note for the embodiment illustrated in FIG. 7, a column cycle time interval $t_{CC}$ is twice the column cycle time interval $t_{CC}$ used in an embodiment illustrated by FIG. 3. Four column addresses are obtained by using a column field CP[8:4], a column field C[8:4] and a select field SEL or SEL value in either COL request packet 801 or COLM request packet 802, respectively, described in detail below and illustrated in FIG. 8. A select or logic value of 1 or 0 identifies which group of memory banks, as shown in FIG. 9, the column address values in column address fields C[8:4] and CP[8:4] is directed toward. A select field SEL that has a "0" value indicates that the column address values are directed toward memory banks 901 and 902; while a select field SEL that has a "1" value indicates that the column address values are directed toward memory banks 903 and 904 of integrated circuit memory device 900. In an alternate embodiment, memory banks are staggered or memory banks 901 and 904 are grouped and memory banks 902 and 903 are grouped in order to save on peak current.

In alternate embodiments, three memory bank address bits or two memory bank address bits may be used for a column address with the use of a SEL bit.

In the embodiment illustrated by FIG. 7, 128 bits or 16 bytes are output from integrated circuit memory device 100 on interconnect DQ per column cycle time interval $t_{CC}$ per each of the four column addresses; while 512 bits or 64 bytes are output per time interval $t_{RR}$.

Figure 8:
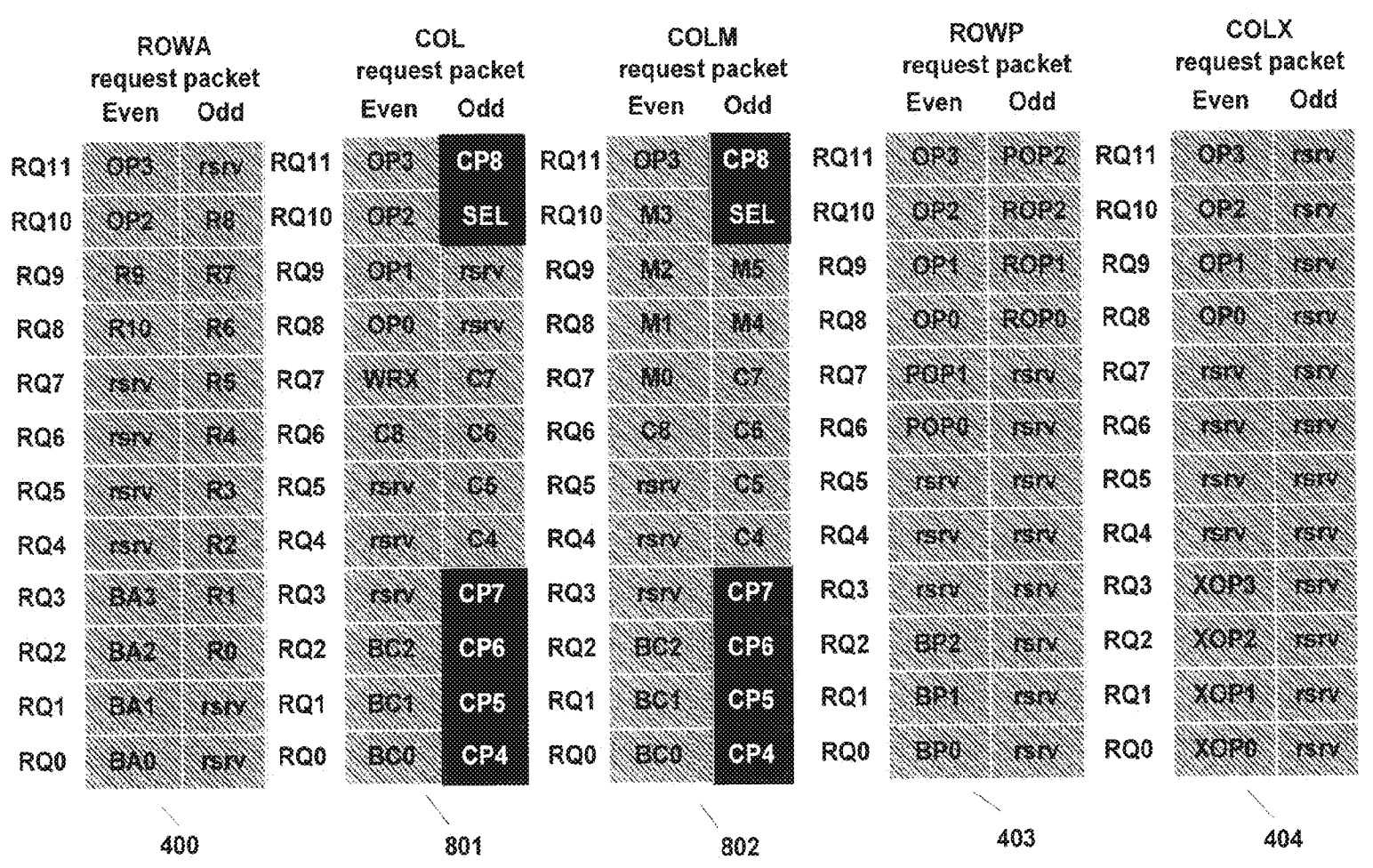

FIG. 8 illustrates formats of request packet 400, 801, 802, 403 and 404, in particular request packets having four column addresses for independently accessing a page of an integrated circuit memory device 100 during a column cycle time interval $t_{CC}$. FIG. 8 illustrates similar request packets shown and described in regard to FIG. 4. However, each request packet 801 and 802 provides a potential for four column addresses to a page per column cycle time interval $t_{CC}$ (2 explicit addresses with varying the SEL bit) instead of a maximum of two column addresses per column cycle time interval $t_{CC}$ in each request packets 401 and 402. In particular, a SEL field is used to identify which group of memory banks the two column address values in respective column address fields C[8:4] and CP[8:4] are directed toward. Address bit value CP[8] is now positioned, as compared to FIG. 4, at the clock signal odd edge of RQ11 and a SEL bit value is provided at the clock signal odd edge of RQ10 in COL and COLM request packets 801 and 802.

FIG. 9 is a simplified block diagram of the integrated circuit memory device 900 that receives four column addresses for independently accessing four columns in a page during a column cycle time interval $t_{CC}$. In an embodiment, integrated circuit memory device 900 is used instead of integrated circuit memory device 100 in memory system 140 described above. In particular, FIG. 9 illustrates integrated circuit memory device 900 having a plurality of memory banks 901, 902, 903 and 904. In an embodiment, each of the memory banks 901, 902, 903 and 904 includes four memory banks. In an embodiment, memory banks 901 (even memory banks B0, B2, B4, B6) and 902 (odd memory banks B1, B3, B5, B7) are grouped and memory banks 903 (odd memory banks B1, B3, B5, B7) and 904 (even memory banks B0, B2, B4, B6) are grouped. In an embodiment, a page in like referenced banks may be simultaneously accessed. For example, a page may be accessed from even memory bank B0 of memory bank 901 and even memory bank B0 of memory bank 904. In effect, two separate memory banks operate as one memory bank in accessing a page.

Memory transactions, in particular memory commands, are input to control logic 905 from interconnect RQ. Control logic 905 includes receiver 108, pipeline register 102 and circuitry 105 as seen in FIG. 1 in an embodiment. Control logic 905 then provides memory control signals, including column and row addresses, to row/col decoders 910, 911, 912 and 913. In an embodiment, each row/col decoder 910, 911, 912 and 913 operates similarly to interconnect A, row decoder 122 and dual column decoder 123 shown in FIG. 1. Likewise, read pipes 906 and 908 coupled to memory banks 901/903 and 902/904 operate similar to sense amplifiers 121, circuitry 106, pipeline register 103 and transmitter 109 shown in FIG. 1. Also, write pipes 907 and 909 coupled to memory banks 901/903 and 902/904 operate similar to sense amplifiers 121, pipeline register 104, circuitry 107 and receiver 110.

Memory banks 901 and 903, as wells as memory banks 902 and 904, have dedicated read and write pipes for reading and writing data from and to storage cells. This grouping allows for master device 130 to provide alternate commands to alternate groups of memory banks that enable full external interconnect or bus DQ utilization. Read data is output and interleaved between the different groups of memory banks in an embodiment.

In an embodiment, a first data interconnect DQ-A having sixteen data signal lines is coupled to memory banks 901 and 903 by read pipe 906 and write pipe 907. A second data interconnect DQ-B having sixteen data signal lines is coupled to memory banks 902 and 904 by read pipe 908 and write pipe 909. A control interconnect RQ is also coupled to an interface of integrated circuit memory device 900 to provide control signals to control logic 905.

Memory banks 901 and 903, as well as memory banks 902 and 904, are able to operate independently. In other words, no timing constraint is imposed when one group of memory banks may be accessed relative to the other group of memory banks. This independent nature of memory bank groups is derived from the fact that the memory groups are isolated from each other. The memory groups are sufficiently decoupled from each other from an electrical noise standpoint that access to one memory group does not corrupt data in another memory group. More specifically, the activation of one set of sense amplifiers associated with a memory group does not corrupt the other set of sense amplifiers associated with the other memory group, regardless of the timing of the ACT commands. In an embodiment, electrical isolation between memory groups is achieved by positioning an interface between memory groups.

Figure 10:
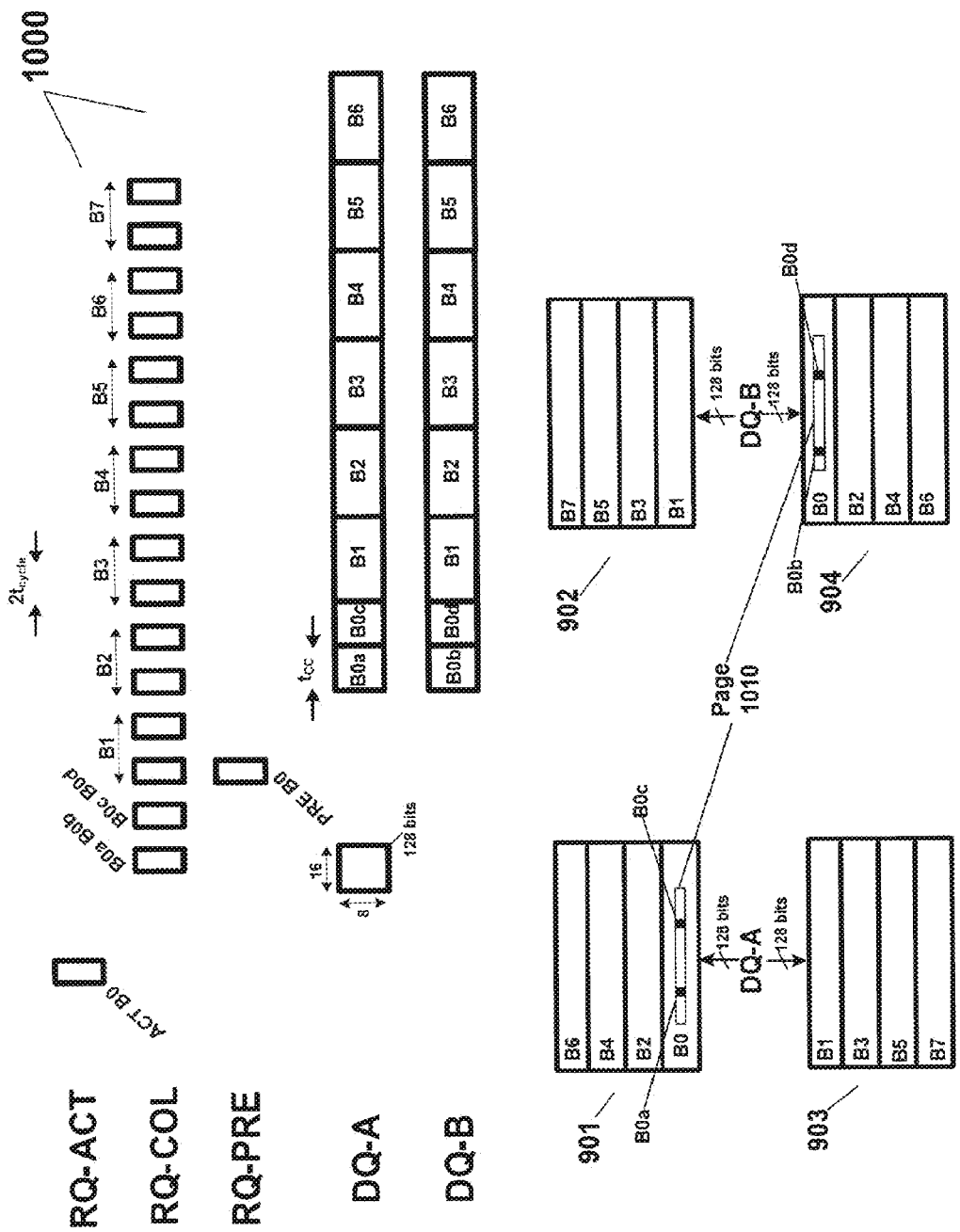
FIG. 10 is a timing diagram and memory bank content mapping illustrating a first mode of operation using dual column mode addressing of the integrated circuit memory device shown in FIG. 9.

FIG. 10 is timing diagram and bank content mapping 1000 illustrating a first mode of operation using a quad column addressing mode of the integrated circuit memory device 900 shown in FIG. 9. FIG. 10 illustrates request packets provided on a control interconnect RQ by master device 130 to output a plurality of data values on interconnects DQ-A and DQ-B from memory banks 901 and 903 as well as 902 and 904, respectively, in integrated circuit memory device 900. The timing of the request packets and subsequent data output on interconnects DQ-A and DQ-B is similar to the timing constraints described above in regard to FIG. 3. An ACT command ACT B0 is provided on interconnect RQ to activate banks B0 in memory banks 901 and 904. In an embodiment, a COL request packet B0a B0b and COL request packet B0c B0d is then asserted on interconnect RQ by master device 130. In an embodiment, COL request packet B0a B0b and COL request packet B0c B0d are in a request format similar to a request packet 401 shown in FIG. 4. Fields C[8:4] contain a first column address for accessing data B0a and fields CP[8:4] contain a second column address for accessing data B0b in page 1010 in banks B0 of memory banks 901 and 904, respectively. Likewise in the second COL request packet B0c B0d, fields C[8:4] contains a first column address for accessing data B0c and fields CP[8:4] contains a second column address for accessing data B0d in page 1010 in banks B0 of memory banks 901 and 904, respectively. A PRE command PRE B0 is then provided on interconnect RQ by master device 130 and directed to banks B0 in memory banks 901 and 904. In an embodiment, data B0a (128 bits or 8 bits by 16 bits of data) is output on interconnect DQ-A during column cycle time interval $t_{CC}$. Likewise, data B0b is output on interconnect DQ-B. During a next column cycle time intervals $t_{CC}$, data B0c and B0d is output from integrated circuit memory device 900 on interconnects DQ-A and DQ-B, respectively. The operation may then be repeated for memory banks B1, B2, B3, B4, B5, B6 and B7 in memory banks 901 and 903 as well as 902 and 904. It should be noted that there is no restriction on accessing memory banks in a particular order in an embodiment illustrated by FIG. 10.

Figure 11:
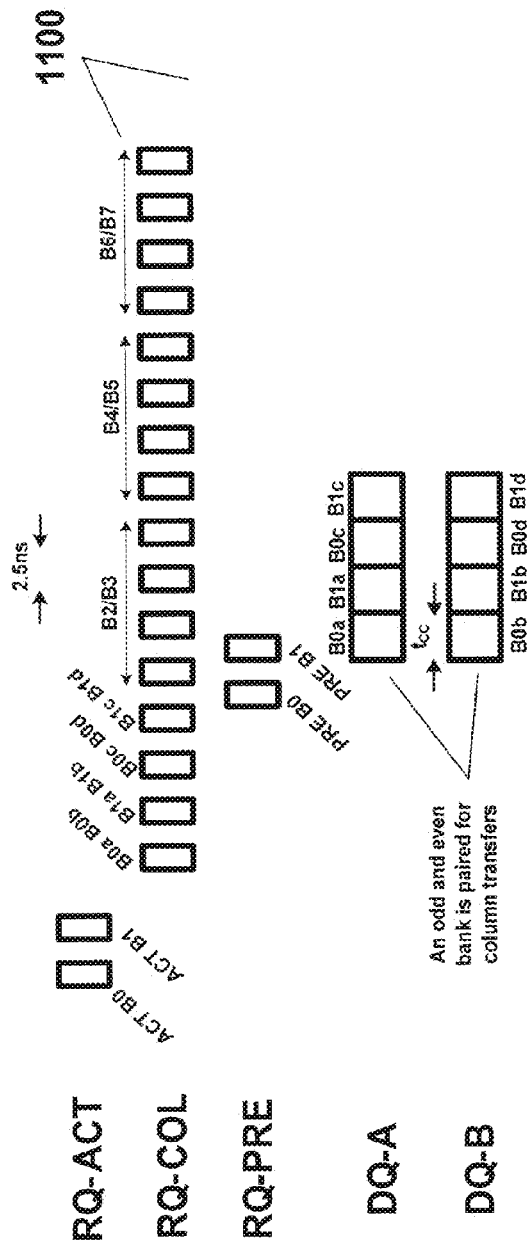
FIG. 11 is timing diagram and memory bank content mapping illustrating a second mode of operation using quad column addressing mode of the integrated circuit memory device shown in FIG. 9.
Figure 11:
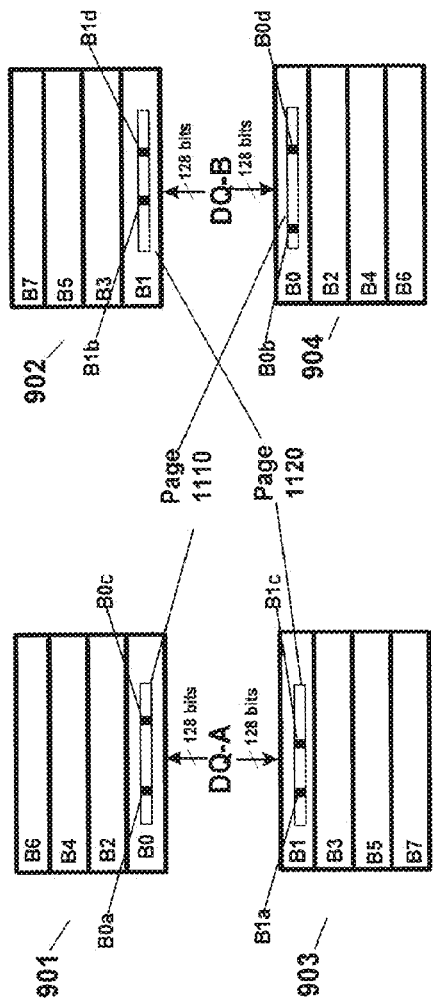

FIG. 11 is timing diagram and memory bank content mapping 1100 illustrating a second mode of operation using a quad column addressing mode of the integrated circuit memory device 900 shown in FIG. 9. In an embodiment illustrated by FIG. 11, an integrated circuit memory device 100 is operating at approximately 250 MHz ($1/t_{CC}$). It is typically more difficult to provide enough data to an interface 100b with low access granularity unless multi-column addressing is used as described herein. In alternate embodiments, an integrated circuit memory device 100 is operating at a relatively faster approximate 500 MHz. FIG. 11, like FIG. 10, illustrates request packets asserted on a control interconnect RQ by master device 130 to output a plurality of data values on interconnects DQ-A and DQ-B from memory banks 901-904 in integrated circuit memory device 900. The timing of the request packets and subsequent data output on interconnects DQ-A and DQ-B is similar to the timing constraints described above in regard to FIG. 3. ACT commands ACT B0 and ACT B1 are asserted on interconnect RQ to activate memory banks B0 and B1 in memory banks 901-904. In an embodiment, four COL request packets B0a B0b, B1a B1b, B0c B0d, and B1c B1d are then asserted on interconnect RQ by master device 130. In an embodiment, COL request packets B0a B0b, B1a B1b, B0c B0d, and B1c B1d are in a request format similar to request packet formats 801 and 802 shown in FIG. 4. Fields CP[8:4], C[8:4] and a SEL value contain column address values for independently accessing four columns of page 1110 in memory banks B0 of memory banks 901 and 904 and page 1120 of banks B1 of memory banks 902 and 903. In particular, the first COL request packet B0a B0b contains the column address for accessing data B0a and B0b in the page 1110 in memory banks B0; the second COLM request packet B1a B1b contains the column address for accessing data B1a and B1b in page 1120; the third COLM request packet B0c B0d contains the column address for accessing data B0c and B0d in page 1110; and the fourth COLM request packet B1c B1d contains the column address for accessing data B1c and B1d in page 1120. In an embodiment, PRE commands PRE B0 and PRE B1 are then asserted on interconnect RQ by master device 130 and directed to memory banks B0 and B1. In an embodiment, data B0a (128 bits or 8 bits by 16 bits of data) is output on interconnect DQ-A during column cycle time interval $t_{CC}$. Likewise, data B0$b$ is output on interconnect DQ-B. During a next column cycle time interval $t_{CC}$, data B1$a$ and B1$b$ is output from integrated circuit memory device 900 on interconnects DQ-A and DQ-B, respectively. During a next column cycle time interval $t_{CC}$, data B0$c$ and B0$d$ is output from integrated circuit memory device 900 on interconnects DQ-A and DQ-B, respectively. Also, during a next column cycle time interval $t_{CC}$, data B1$c$ and B1$d$ is output from integrated circuit memory device 900 on interconnects DQ-A and DQ-B, respectively. It should be noted that data output from odd and even pairs of memory banks are paired to avoid conflicts.

Various aspects of the subject-matter described herein are set out non-exhaustively in the following numbered clauses:

1. An integrated circuit memory device, comprising:
    an interface;
    a storage array having a row of storage cells; and
    a column decoder to access the row of storage cells, wherein the integrated circuit memory device is operable in a first mode and second mode of operation, wherein:
        during the first mode of operation, the row of storage cells is accessible from the interface in response to a first column address; and
        during the second mode of operation, a first plurality of storage cells in the row of storage cells is accessible from the interface in response to a second column address and a second plurality of storage cells in the row of storage cells is accessible from the interface in response to a third column address, wherein the first plurality of storage cells and the second plurality of storage cells are concurrently accessible from the interface.

2. The integrated circuit memory device of clause 1, wherein the first and second plurality of storage cells are accessible during a column cycle time interval.

3. The integrated circuit memory device of clause 1, wherein a first plurality of data is output from the first plurality of storage cells onto the interface during a first time interval and a second plurality of data is output onto the interface from the second plurality of storage cells during a second time interval.

4. The integrated circuit memory device of clause 1, wherein a first and second plurality of data is output from the first and second plurality of storage cells, respectively, onto the interface during a first time interval.

5. An integrated circuit memory device, comprising:
    an interface;
    a first storage array having a first row of storage cells;
    a second storage array having a second row of storage cells;
    a first column decoder to access the first row of storage cells; and
    a second column decoder to access the second row of storage cells, wherein the integrated circuit memory device is operable in a first mode and a second mode, wherein:
        during the first mode of operation, the first row of storage cells is accessible from the interface in response to a first column address; and
        during the second mode of operation, a first and second plurality of data stored in the first and second row of storage cells, respectively, is accessible from the interface in response to a second and third column address, and a third and fourth plurality of data stored in the first and second row of storage cells, respectively, is accessible from the interface in response to a fourth and fifth column address, wherein the first plurality of data and the second plurality of data are concurrently provided at the interface, and wherein the third plurality of data and the fourth plurality of data are concurrently provided at the interface.

6. The integrated circuit memory device of clause 5, wherein the first and second plurality of data is provided at the interface during a first time interval, and the third and fourth plurality of data is provided at the interface during a second time interval.

7. The integrated circuit memory device of clause 6, wherein the interface is coupled to a first interconnect to transfer the first plurality of data and a second interconnect to transfer the second plurality of data.

8. An integrated circuit memory device, comprising:
    an interface;
    a first memory bank having a first row of storage cells;
    a second memory bank having a second row of storage cells;
    a third memory bank having a third row of storage cells;
    a fourth memory bank having a fourth row of storage cells;
    a first column decoder to access the first row of storage cells;
    a second column decoder to access the second row of storage cells;
    a third column decoder to access the third row of storage cells; and
    a fourth column decoder to access the fourth row of storage cells, wherein the integrated circuit memory device is operable in a first mode and second mode of operation, wherein:
        during the first mode of operation, the first row of storage cells is accessible from the interface in response to a first column address; and
        during the second mode of operation, a first and second plurality of data stored in the first and second row of storage cells, respectively, is accessible from the interface in response to a second and third column address, and a third and fourth plurality of data stored in the third and fourth row of storage cells, respectively, is accessible from the interface in response to a fourth and fifth column address.

9. The integrated circuit memory device of clause 8, wherein the first and second plurality of data is provided at the interface during a first time interval, and the third and fourth plurality of data is provided at the interface during a second time interval.

10. The integrated circuit memory device of clause 8, wherein the interface is coupled to a first interconnect to transfer the first and third plurality of data and a second interconnect to transfer the second and fourth plurality of data 11. A memory system comprising:
    a master device to provide a first, second and third column address; and
    an integrated circuit memory device, including:
        an interface coupled to the master device;
        a first storage array having a first row of storage cells; and
        a column decoder to access the first row of storage cells, wherein the integrated circuit memory device is operable in a first mode and second mode of operation, wherein:
            during the first mode of operation, the first row of storage cells is accessible from the interface in response to the first column address; and during the second mode of operation, a first plurality of storage cells in the first row of storage cells is accessible from the interface in response to the second column address and a second plurality of storage cells in the first row of storage cells is accessible from the interface in response to the third column address.

12. The memory system of clause 11, wherein the second and third column addresses are transferred in a request packet by the master device.

13. The memory system of clause 11, wherein the first and second plurality of storage cells are accessible during a column cycle time interval.

14. The memory system of clause 11, wherein the master device is a graphics controller.

15. The memory system of clause 11, wherein the master device is a memory controller.

16. The memory system of clause 11, wherein the master device provides a fourth and fifth column address, and the integrated circuit memory device is operable in a third mode of operation, wherein:
during the third mode of operation, a first and second plurality of storage cells in the first row of storage cells is accessible at the interface in response to the second and third column address and a second and third plurality of storage cells in a second row of storage cells is accessible from the interface in response to a fourth and fifth column address.

17. The memory system of clause 16, wherein the second and third column addresses are transferred in a first request packet and the fourth and fifth column addresses are transferred in a second request packet by the master device.

18. The system of clause 16, wherein the master device is coupled to the integrated circuit memory device by a first and second external interconnect, wherein a first plurality of data is output from the first row in a first memory bank onto the first interconnect during a first time interval and a second plurality of data is output onto the second interconnect from the second row in a second memory bank during the first time interval.

19. A method comprising:
receiving a first column address to access a first plurality of storage cells in a row of storage cells during a first time interval; and
receiving a second column address to access a second plurality of storage cells in the row of storage cells during the first time interval.

20. The method of clause 19, wherein the first time interval is a column cycle time interval.

21. The method of clause 19, further comprising:
generating the first column address by a master device; and
generating the second column address by the master device.

22. The method of clause 21, wherein the first and second column addresses are in a request packet.

23. A method comprising:
receiving a first column address to access a first plurality of storage cells in a first row of storage cells during a first time interval;
receiving a second column address to access a second plurality of storage cells in a second row of storage cells during the first time interval;
receiving a third column address to access a third plurality of storage cells in the first row during a second time interval; and
receiving a fourth column address to access a fourth plurality of storage cells in the second row of storage cells during the second time interval.

24. The method of clause 23, wherein the first and second time intervals are column cycle time intervals.

25. The method of clause 23, wherein the first row of storage cells is in a first memory bank and the second row of storage cells is in a second memory bank.

26. An integrated circuit memory device, comprising:
a storage array having a row of storage cells; and
means for accessing a first plurality of storage cells in the row in response to a first column address and accessing a second plurality of storage cells in the row, during a column cycle time interval, in response to a first and second column address.

The foregoing description of the preferred embodiments of the present application has been provided for the purposes of illustration and description. It is not intended to be exhaustive or to limit the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit memory device, comprising:
at least one storage array having storage cells arranged in plural rows and plural columns;
a row decoder to select a row of storage cells within the at least one storage array;
an interface to couple the integrated circuit memory device with an external interconnect; and
circuitry to concurrently convey data between the interface and a subset of the selected row corresponding to at least two selectively non-contiguous column addresses.

2. The integrated circuit memory device of claim 1, where:
a minimum time interval comprising a minimum number of clock cycles must elapse between successive accesses to an open row of storage cells in each storage array the at least one storage array; and
the memory device outputs data read from the subset during a time period less than twice the minimum time interval.

3. The integrated circuit memory device of claim 2, further comprising multiple modes of operation including a first mode of operation in which a contiguous set of read data is output from the open row within the time period, and a second mode of operation in which two selectively non-contiguous columns of read data are output within the time period, the two selectively non-contiguous columns of read data in the second mode each representing smaller data granularity than the set of read data in the first mode.

4. The integrated circuit memory device of claim 2, where the memory device outputs data read from the open row for columns representing at least three different, selectively non-contiguous column addresses to the external interconnect via the interface during the time period.

5. The integrated circuit memory device of claim 1, where the circuitry is to concurrently select the subset of the selected row corresponding to the at least two selectively non-contiguous column addresses in response to a single request packet.

6. The integrated circuit memory device of claim 1, where:
the storage array includes two banks;

the circuitry includes two independent column decoders, one respective to each bank; and the integrated circuit memory device further comprises at least thirty-two selectable columns for each bank.

7. The integrated circuit memory device of claim 1, where the interface includes plural contacts to exchange data with a remote memory controller via the external interconnect, and where the integrated circuit memory device is to output data associated with a first one of the at least two selectively non-contiguous column addresses on a first subset of the plural contacts associated with the external interconnect and to concurrently output data associated with a second one of the at least two selectively non-contiguous column addresses on a second subset of the plural contacts associated with the external interconnect, the first and second subsets being mutually exclusive.

8. The integrated circuit memory device of claim 1, further comprising at least one contact to exchange data with a remote memory controller via the external interface, and where the integrated circuit memory device is to output data associated with each of the at least two selectively non-contiguous column addresses in a time multiplexed manner over the at least one contact.

9. The integrated circuit memory device of claim 1, further comprising circuitry to mask a portion of at least one column in response to an externally provided mask command.

10. The integrated circuit memory device of claim 1, where the circuitry is to generate respective addresses for the subset of the selected row from a single request packet.

11. The integrated circuit memory device of claim 10, where the single request packet includes at least two independent column addresses within the selected row, including the at least two selectively non-contiguous column addresses.

12. The integrated circuit memory device of claim 1, where the at least one storage array includes at least two banks.

13. The integrated circuit memory device of claim 12, where the at least two banks are accessed together to access respective portions of a page of data, and where one column address of the at least two selectively non-contiguous column addresses corresponds to a first one of the at least two banks and where another column address of the at least two selectively non-contiguous column addresses corresponds to a second one of the banks.

14. The integrated circuit memory device of claim 12, where each one of the at least two banks includes separate read and write pipes.

15. The integrated circuit memory device of claim 12, where the banks are organized as bank groups.

16. The integrated circuit memory device of claim 12, where the banks are to be alternated between to provide full utilization of the external interconnect.

17. The integrated circuit memory device of claim 1, where each of the at least two selectively non-contiguous columns stores a tile of image data.

18. The integrated circuit memory device of claim 1, further comprising at least one sense array, where the circuitry is to concurrently output read data corresponding to the at least two selectively non-contiguous column addresses from the at least one sense array to the interface.

19. An integrated circuit memory device, comprising:
at least one storage array having storage cells arranged in plural rows and plural columns;
a row decoder to select a row of storage cells within the at least one storage array;
an interface to couple the integrated circuit memory device with an external interconnect; and
circuitry to generate multiple column addresses for accessing respective, selectively non-contiguous portions of the selected row during a single column cycle time interval and to exchange data via the interface with the external interconnect.

20. The integrated circuit memory device of claim 19, where:
a minimum time interval comprising a minimum number of clock cycles must elapse between successive accesses to an open row of storage cells in the at least one storage array; and
the memory device outputs data read from the subset of the open row during a time period less than twice the minimum time interval.

21. The integrated circuit memory device of claim 20, further comprising multiple modes of operation including a first mode of operation in which a set of read data is output from a contiguous section of the open row within the time period, and a second mode of operation in which two selectively-non-contiguous columns of read data are output from the open row within the time period.

22. The integrated circuit memory device of claim 21, where the two selectively-non-contiguous columns of read data in the second mode each represent smaller data granularity than the set of read data in the first mode.

23. The integrated circuit memory device of claim 20, where the memory device outputs data read from the open row for columns representing at least three different, selectively non-contiguous column addresses to the external interconnect via the interface during the time period.

24. The integrated circuit memory device of claim 19, where the circuitry is to concurrently select the at least two selectively non-contiguous columns in the selected row in response to a single request packet.

25. The integrated circuit memory device of claim 19, where:
the storage array includes two banks;
the circuitry includes two independent column decoders, one respective to each bank; and
the integrated circuit memory device further comprises at least thirty-two selectable columns for each bank.

26. The integrated circuit memory device of claim 19, where the interface includes plural contacts to exchange data with a remote memory controller via the external interconnect, and where the integrated circuit memory device is to output data associated with a first one of the multiple addresses on a first subset of the plural contacts associated with the external interconnect and to concurrently output data associated with a second one of the multiple column addresses on a second subset of the plural contacts associated with the external interconnect, the first and second subsets being mutually exclusive.

27. The integrated circuit memory device of claim 19, further comprising at least one contact to exchange data with a remote memory controller via the external interface, and where the integrated circuit memory device is to output data associated with each of the multiple column addresses in a time multiplexed manner over the at least one contact.

28. The integrated circuit memory device of claim 19, further comprising circuitry to mask a portion of at least one column in response to an externally provided mask command.

29. The integrated circuit memory device of claim 19, where the circuitry is to generate the multiple column addresses from a single request packet.

30. The integrated circuit memory device of claim 29, where the single request packet includes at least two independent column addresses for the selected row.

31. The integrated circuit memory device of claim 19, where the at least one storage array includes at least two banks.

32. The integrated circuit memory device of claim 31, where the at least two banks are accessed together to access respective portions of a page of data, and where one column corresponding to the multiple column addresses is in a first one of the at least two banks and where another column corresponding to the multiple column addresses is in a second one of the banks.

33. The integrated circuit memory device of claim 31, where each one of the at least two banks includes separate read and write pipes.

34. The integrated circuit memory device of claim 31, where the banks are organized as bank groups.

35. The integrated circuit memory device of claim 31, where the banks are to be alternated between to provide full utilization of the external interconnect.

36. The integrated circuit memory device of claim 19, further comprising multiple columns within each row, where each column stores a tile of image data.

37. The integrated circuit memory device of claim 19, further comprising at least one sense array, where the circuitry is to concurrently output read data for the selectively noncontiguous portions of the selected row to the interface as a contiguous set of data.

38. An integrated circuit memory device, comprising:
first, second, third and fourth storage arrays each having storage cells arranged in plural rows and plural columns;
a first row decoder to select a row of storage cells within the first array and the second array;
a second row decoder to select a row of storage cells within the third array and the fourth array;
an interface to couple the first and third storage arrays with a first portion of an external interconnect and to couple the third and fourth storage arrays with a second portion of an external interconnect;
circuitry to concurrently convey data between first and second columns within the first and second storage arrays, respectively, and the interface, and to concurrently convey data between third and fourth columns within the third and fourth storage arrays, respectively, and the interface, so as to concurrently exchange data between at least two columns for each selected row and the interface where the column addresses for the first and second columns are selectively non-contiguous, and
where column addresses for the third and fourth columns are selectively non-contiguous.

39. The integrated circuit memory device of claim 38, where column addresses for the first and second columns are generated by the circuitry from a single request packet, and where column addresses for the third and fourth columns are generated by the circuitry from a single request packet.

* * * * *